United States Patent [19]

Gempe

[11] Patent Number: 5,223,728
[45] Date of Patent: Jun. 29, 1993

[54] OPTICAL SWITCH INTEGRATED CIRCUIT

[75] Inventor: Horst A. Gempe, Phoenix, Ariz.

[73] Assignee: Motorola, Inc., Schaumburg, Ill.

[21] Appl. No.: 862,130

[22] Filed: Apr. 2, 1992

[51] Int. Cl.⁵ .............................. H01L 27/14
[52] U.S. Cl. .................... 257/290; 257/443;
    257/292; 257/461; 257/458; 307/311;
    250/208.4
[58] Field of Search ............ 257/462, 458, 461, 293,
    257/443, 290, 292; 307/311; 359/243;
    250/208.4

[56] References Cited

U.S. PATENT DOCUMENTS

| 4,742,380 | 5/1988 | Chang et al. | 307/311 X |
|---|---|---|---|
| 4,841,138 | 6/1989 | Muro | 257/461 X |
| 4,906,856 | 3/1990 | Iwanami et al. | 257/462 X |
| 5,101,253 | 3/1992 | Mizutani et al. | 257/431 X |
| 5,105,090 | 4/1992 | Miyajima et al. | 307/311 X |

Primary Examiner—William Mintel
Attorney, Agent, or Firm—Joe E. Barbee

[57] ABSTRACT

An optical switch integrated circuit (32) fabricated as a monolithic integrated circuit is used to couple a load (18) to a voltage source (17). The optical switch integrated circuit (32) comprises a SCR for coupling the load (18) to the voltage source (17), a photo detector for sensing ambient light conditions and enabling a means to disable the SCR, and a means to enable the SCR.

20 Claims, 1 Drawing Sheet

OPTICAL SWITCH INTEGRATED CIRCUIT

BACKGROUND OF THE INVENTION

This invention relates, in general, to optical switches, and more particularly to an integrated optical switch which senses ambient lighting and couples or decouples a load from a voltage source.

For example, ambient light sensed by an optical sensor triggers circuitry which couples a load to a voltage source when light falls below a preset threshold. A common application for this type of optical switch is to turn a light bulb on or off depending on ambient lighting conditions. The voltage source which is coupled to the load through the optical switch is 120 VAC.

Design factors for this type of optical switch are very simple. First, the optical switch must be able to handle the power requirements of the load. Second, specifications for the optical sensor are not extremely critical. Finally, the overriding factor in the design of the optical switch pertain to cost, manufacturability, and the simplicity in which it can be integrated in a lighting system.

Previous methods for building a cost effective optical switch involved discrete components. Typically, a discrete SCR is used to couple a light source (or load) to a voltage source, a discrete optical sensor (for example, a CdS photo resistor) monitors ambient light conditions and will change resistance based on the light it receives, the optical sensor in combination with a resistor are used as a control element for enabling or disabling the SCR. From a manufacturing standpoint, the individual components must be purchased separately, assembled on a breadboard, and the breadboard integrated into the lighting system. Building the optical switch from discrete components increases costs, increases assembly time, is more prone to manufacturing errors (due to the number of components which must be handled), and uses space inefficiently.

It would be of great value if an integrated optical switch were available which reduces size, reduces cost, and eliminates the need for assembling a switch from discrete components.

SUMMARY OF THE INVENTION

Briefly stated, this invention is an integrated optical switch for coupling a load to a voltage source. The optical switch integrated on a semiconductor chip comprises an SCR for coupling the load to the voltage source, a means for enabling the SCR, a means for disabling the SCR, and a photo detector which couples to the means for disabling the SCR, the photo detector activates the means for disabling the SCR when ambient lighting is above a preset threshold. The means for disabling the SCR also overrides the means for enabling the SCR.

DETAILED DESCRIPTION OF THE DRAWINGS

Figure 1:
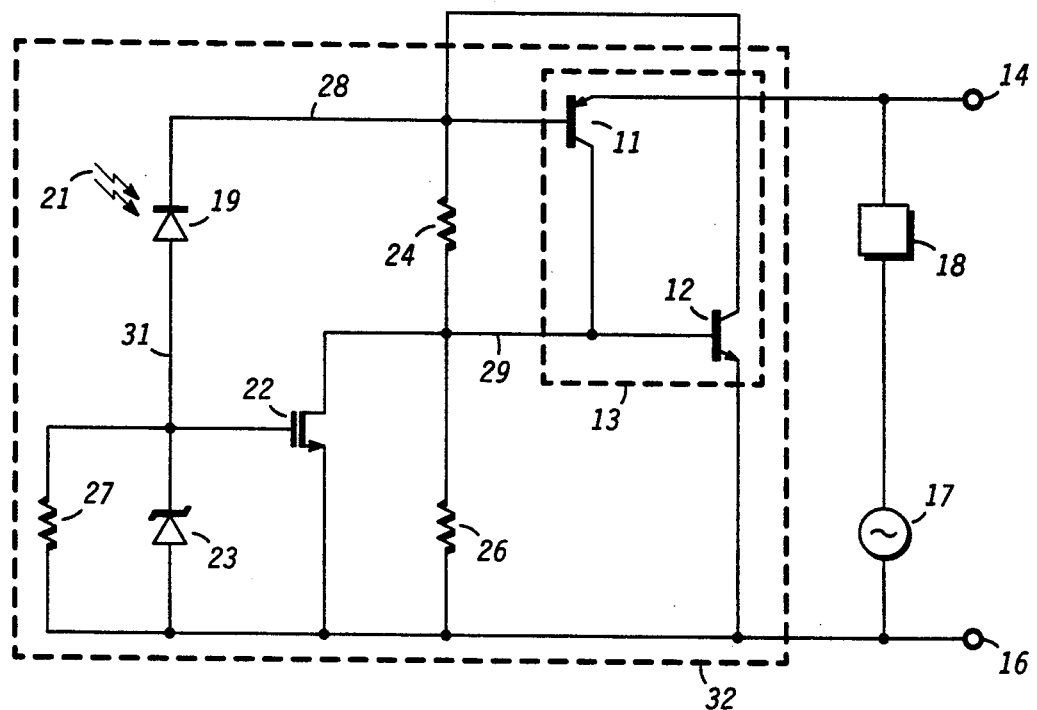
FIG. 1 is a schematic diagram of an embodiment in accordance with the present invention.

FIG. 1 is a schematic diagram of a preferred embodiment of an optical switch integrated circuit 32. All elements of optical switch integrated circuit 32 are formed on a single semiconductor die which eliminates the need for and assembly of discrete components.

An SCR is formed from a bipolar PNP transistor 11 and a bipolar NPN transistor 12. The SCR is enclosed by a dotted line 13. A first input terminal 14 terminal is connected to the emitter of bipolar PNP transistor 11. A second input terminal 16 is connected to the emitter of bipolar NPN transistor 12. The SCR when enabled couples a voltage source 17 to a load 18. Load 18 is a light bulb in FIG. 1. In the preferred embodiment, voltage source 17 is 120 volt alternating current.

Bipolar PNP transistor 11 has a base coupled to a line 28 and a collector coupled to a line 29. Bipolar transistor 12 has a base coupled to line 29 and a collector coupled to line 28. When forming the SCR, the base of bipolar PNP transistor 11 corresponds to the collector of bipolar NPN transistor 12 and the collector of bipolar PNP transistor 11 corresponds to the base of bipolar NPN transistor 12. Combined current gain of bipolar PNP transistor 11 and bipolar NPN transistor 12 must be greater than 1.0 for the SCR to function.

In the preferred embodiment, a photo diode 19 serves as a photo sensing means or photo detector. A photo transistor or darlington photo transistor can also be used as the photo sensing means or photo detector. Photo diode 19 is exposed to ambient lighting conditions as indicated by arrow 21. The cathode of photo diode 19 is connected to line 28 and the anode of photo diode 19 is connected to a line 31.

A MOSFET transistor 22 serves as a means for disabling the SCR. The gate of MOSFET transistor 22 is connected to line 31, the source of MOSFET transistor 22 is connected to second input terminal 16, and the drain of MOSFET transistor 22 is connected to line 29. In the preferred embodiment MOSFET transistor 22 is an n-channel enhancement MOSFET.

A zener diode 23 serves as a voltage clamping means. The cathode of zener diode 23 is connected to line 31 and the anode of zener diode 23 is connected to second input terminal 16. Zener diode 23 has a predetermined breakdown voltage which limits voltage from the gate to the source of MOSFET transistor 22.

A first resistor 24 couples line 28 to line 29. First resistor 24 serves as a resistor load to MOSFET transistor 22 when MOSFET transistor 22 is enabled. A second resistor 26 couples line 29 to second input terminal 16. First resistor 24 and second resistor 26 form a voltage divider when MOSFET transistor 22 is disabled. The voltage divider is used to enable the SCR at a predetermined voltage. The voltage divider formed by first resistor 24 and second resistor 26 serves as a means for enabling.

In the preferred embodiment, first resistor 24 and second resistor 26 are made of substantially similar material such as polysilicon, metal, single crystal silicon, or the like. This will allow the voltage divider ratio to remain constant over varying voltages and temperatures.

A third resistor 27 may be needed to prevent leakage current from photo diode 19 from enabling MOSFET transistor 22. Third resistor 27 couples line 31 to second input terminal 16 and is optional.

Voltage source 17 is household line voltage or 120 VAC @ 60 Hz. Voltage from first input terminal 14 to second input terminal 16 varies with voltage source 17 ranging from a positive 120 V to a negative 120 V Operation of optical switch integrated circuit 32 can be broken into three different modes. In a first mode, voltage source 17 couples a negative voltage across terminals 14 and 16 which is referred to as a negative voltage half cycle. The negative voltage half cycle reverse biases the base-emitter junctions of bipolar PNP transistor 11 and bipolar NPN transistor 12. The SCR is disabled under this condition and load 18 is decoupled from voltage source 17.

In a second mode, voltage source 17 couples a positive voltage across terminals 14 and 16 (voltage source 17 transitions from the negative half cycle to a positive half cycle) which is referred to as a positive voltage half cycle. Photo diode 19 is reverse biased. Ambient light indicated by arrow 21 shines on photo diode 19. Ambient light conditions are above a preset threshold. The preset threshold corresponds to ambient lighting conditions and determines when the SCR is enabled or disabled. As the positive voltage increases photo diode 19 generates a current due to the ambient light which strikes photo diode 19, the current charges up the gate of MOSFET transistor 22. The gate of MOSFET transistor 22 continues to charge up past a threshold voltage, thereby enabling MOSFET transistor 22. Enabled MOSFET transistor 22 sinks a current through first resistor 24 or shorts line 29 to the emitter of NPN transistor 12. Bipolar NPN transistor 12 is disabled during the positive voltage half cycle when ambient light conditions are above the preset threshold.

Zener diode 23 serves as a voltage clamping means which limits voltage across the gate to source of MOSFET transistor 22 by breaking down at a predetermined voltage. If voltage across the gate to source of MOSFET transistor 22 was not limited by zener diode 23 during the positive voltage half cycle MOSFET transistor 22 could be permanently destroyed.

In a third and final mode, the SCR is enabled during the positive voltage half cycle. Ambient light striking photo diode 19 (indicated by arrow 21) is below the preset threshold. Ambient light does not generate any appreciable current from reverse biased photo diode 19 to charge the gate of MOSFET transistor 22. In other words, MOSFET transistor 22 is disabled during the third mode. To insure this occurs, zener diode 23 is fabricated to have a larger leakage current than photo diode 19, thereby eliminating MOSFET transistor 22 from being enabled by photo diode 19 leakage current. Zener diode 23 serves as a means for sinking leakage current. If zener diode 23 cannot sink all the leakage current from photo diode 19 then third resistor 27 is needed to prevent MOSFET transistor 22 from being enabled. Third resistor 27 has a resistor value which does not develop a voltage drop greater than the threshold voltage of MOSFET transistor 22 from leakage current of photo diode 19, thereby disabling MOSFET transistor 22.

Voltage on line 28 follows the voltage on first input terminal 14 through base-emitter junction of bipolar PNP transistor 11. A voltage divider is formed by first resistor 24 and second resistor 26 (MOSFET transistor 22 is disabled). The SCR is enabled when the base-emitter junction of bipolar NPN transistor 12 is forward biased and the combined voltage gain of bipolar PNP transistor 11 and bipolar NPN transistor 12 is greater than 1.0. The voltage at line 29 can be calculated from the following equation: (voltage at line 29)=(voltage at line 28)×(resistor 26/(resistor 24+resistor 26)). The positive voltage on line 28 needed to enable the SCR through the voltage divider is greater than the positive voltage on line 28 needed for photo diode 19 and MOSFET transistor 22 to disable the SCR. During a positive voltage half cycle the SCR can be disabled before it can be enabled.

Once enabled, the SCR couples load 18 to voltage source 17. The SCR is disabled as the positive voltage half cycle transitions to the negative voltage half cycle.

The optical switch integrated circuit 32 uses a minimal number of components which can be integrated as a single monolithic semiconductor. It can be built in a single package having two inputs and a transmissive area for exposing photo diode 19 to ambient lighting. Using a single optical switch, integrated circuit 32 also saves having to purchase and stock separate components, eliminates breadboard assembly, and saves area due to its small size.

Figure 2:
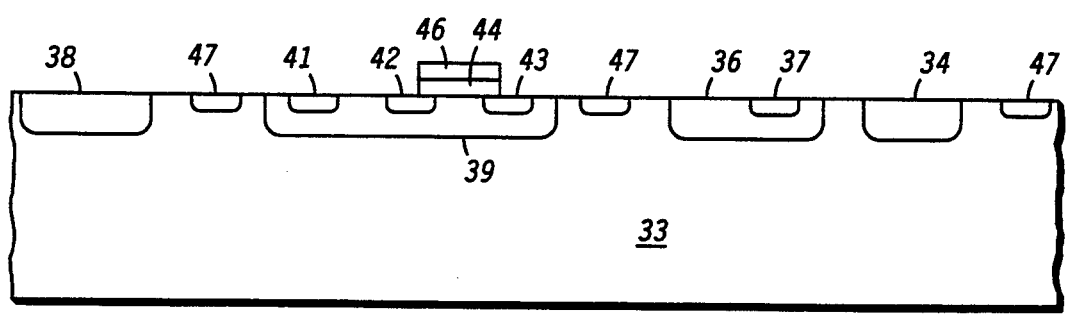
FIG. 2 is a cross-sectional view of a semiconductor die illustrating components which form the embodiment of FIG. 1.

FIG. 2 is a cross-sectional view of a semiconductor die illustrating components of an optical integrated switch circuit. The process flow needed to build the optical integrated switch circuit is very simple which minimizes fabrication costs. Implants and process steps are kept to a minimum.

The optical integrated switch circuit is fabricated on a semiconductor wafer which has an n-substrate 33. A first p-region 34 is formed in n-substrate 33. First p-region 34 serves as the emitter of bipolar PNP transistor 11 of FIG. 1 and couples to first input terminal 14 of FIG. 1. N-substrate 33 near first p-region 34 serves as the base of bipolar PNP transistor 11. A second p-region 36 serves as a collector for bipolar PNP transistor 11. In the preferred embodiment, bipolar PNP transistor 11 is a lateral bipolar PNP transistor.

A first n-region 37 is fabricated in second p-region 36. First n-region 37 serves as the emitter of bipolar NPN transistor 12 of FIG. 1 and couples to second input terminal 16 of FIG. 1. Second p-region 36 serves as the base region of bipolar NPN transistor 12 and corresponds to the the collector of bipolar PNP transistor 11. N-substrate 33 near second p-region 36 serves as the collector of bipolar NPN transistor 12 and corresponds to the base of bipolar PNP transistor 11. In the preferred embodiment, bipolar NPN transistor 12 is a vertical NPN transistor. Bipolar PNP transistor 11 and bipolar NPN transistor 12 combine to form the SCR of FIG. 1. Combined current gain of bipolar transistor PNP 11 and bipolar NPN transistor 12 must be greater than one to form the SCR. First p-region 34 and second p-region 36 are in close proximity to one another to maximize lateral PNP transistor gain and minimize parasitic resistance effects through n-substrate 33.

A third p-region 38 is fabricated in n-substrate 33. Third p-region 38 is the anode of photo diode 19 of FIG. 1. N-substrate 33 near third p-region 38 serves as the cathode of photo diode 19.

A fourth p-region 39 is fabricated in n-substrate 33. A second n-region 41 is fabricated in fourth p-region 39. Second n-region 41 is the cathode of zener diode 23 of FIG. 1. Fourth p-region 39 serves as the cathode of zener diode 23.

A third n-region 42 is fabricated in fourth p-region 39. Third n-region 42 serves as the source of MOSFET transistor 22 of FIG. 1. A fourth n-region 43 is fabricated in fourth p-region 39. Fourth n-region 43 serves as a drain for MOSFET transistor 22. A gate oxide 44 and a gate material 46 complete the fabrication of MOSFET transistor 22.

First resistor 24, second resistor 26, and third resistor 27 of FIG. 1 are not illustrated on FIG. 2. These resistors can be formed as diffused resistors in n-substrate 33, or as polysilicon resistors, or as metal film resistors both of which are deposited on oxide above the n-substrate 33 surface. First resistor 24 and second resistor 26 are made from substantially similar material to insure tracking over varying temperature and voltage conditions.

A plurality of n-region 47 contacts are fabricated in n-substrate 33 to provide contact points for coupling to n-substrate 33 near each device. Devices illustrated in FIG. 2 are coupled together as shown in FIG. 1 through metal interconnect.

In the preferred embodiment, the process is greatly simplified by fabricating first p-region 34, second p-region 36, and third p-region 38 using substantially similar dopings. In other words, these p-regions (34, 36 and 38) are formed at the same time and each has a similar doping profile. Likewise, first n-region 37, second n-region 41, third n-region 42, fourth n-region 43, and the plurality of n-region contacts 47 are fabricated using substantially similar dopings.

By now it should be appreciated that there has been provided an optical switch integrated circuit for coupling a load to a voltage source. Optical switch integrated circuit 32 is fabricated as a monolithic integrated circuit eliminating the need for discrete components. A discrete optical switch requires breadboard fabrication which is subject to defective parts and yield loss during assembly. Eliminating these steps with optical switch integrated circuit 32 saves manufacturing time and money. Optical switch integrated circuit 32 is also smaller than a discrete optical switch saving area and reducing system area requirements. Optical switch integrated circuit 32 is easily fabricated and yields a small die size. The process flow used to build optical switch integrated circuit 32 minimizes process steps which reduces cost and increases yields.

I claim:

1. An optical switch integrated circuit for coupling a voltage source to a load when ambient lighting falls below a preset threshold comprising:
   a bipolar PNP transistor having an emitter which is a first output, a base, and a collector;
   a bipolar NPN transistor having an emitter which is a second output, a base corresponding to the collector of the bipolar PNP transistor, and a collector corresponding to the base of the bipolar PNP transistor, wherein the bipolar PNP and NPN form an SCR;
   a photo sensing means having a cathode corresponding to the base of the bipolar PNP transistor and an anode, wherein the photo sensing means has a predetermined area exposed to ambient lighting;
   a MOSFET transistor having a gate coupled to the anode of the photo sensing means, a drain coupled to the collector of the bipolar PNP transistor, and a source coupled to the second output, wherein the MOSFET transistor is enabled by the photo sensing means and is used to disable the SCR when ambient lighting conditions are above the preset threshold;
   a first resistor which couples the base of the bipolar PNP transistor to the collector of the bipolar PNP transistor;
   a second resistor which couples the collector of the bipolar PNP transistor to the second output, the first and second resistors are used to enable the SCR when ambient lighting conditions are below the preset threshold; and
   a voltage clamping means which limits voltage across the anode of the photo sensing means and the second output, thereby limiting voltage across the MOSFET gate to source.

2. The optical switch integrated circuit for coupling a voltage source to a load when ambient lighting falls below a preset threshold of claim 1, wherein the bipolar PNP transistor is a lateral bipolar PNP transistor and the emitter of the lateral bipolar PNP transistor is coupled to a 120 volt alternating current source.

3. The optical switch integrated circuit for coupling a voltage source to a load when ambient lighting falls below a preset threshold of claim 1, wherein the bipolar NPN transistor is a vertical bipolar NPN transistor.

4. The optical switch integrated circuit for coupling a voltage source to a load when ambient lighting falls below a preset threshold of claim 1, wherein the photo sensing means is a photo diode.

5. The optical switch integrated circuit for coupling a voltage source to a load when ambient lighting falls below a preset threshold of claim 1, further including:
   a third resistor which couples the photo sensing means anode to the second output, wherein the third resistor is used to prevent leakage current from the photo sensing means from enabling the MOSFET transistor.

6. The optical switch integrated circuit for coupling a voltage source to a load when ambient lighting falls below a preset threshold of claim 1, wherein the voltage clamping means is a zener diode, the zener diode has a predetermined breakdown voltage which limits voltage across the MOSFET transistor gate to source.

7. The optical switch integrated circuit for coupling a voltage source to a load when ambient lighting falls below a preset threshold of claim 1, wherein the voltage clamping means has a higher leakage current than the photo sensing means, thereby insuring that leakage current from the photo sensing means will not enable the MOSFET transistor.

8. The optical switch integrated circuit for coupling a voltage source to a load when ambient lighting falls below a preset threshold of claim 1, wherein the MOSFET transistor is an n-channel enhancement MOSFET transistor.

9. An integrated optical switch circuit comprising:
   a semiconductor wafer which has an n-type substrate;
   a first p-type region in the n-type substrate, wherein the first p-type region forms an emitter of a bipolar PNP transistor and is a first output of the integrated optical switch circuit, wherein the n-substrate near the first p-type region serves as a base region of the bipolar PNP transistor;
   a second p-type region in the n-type substrate, wherein the second p-type region serves as a collector region of the bipolar PNP transistor;
   a first n-type region in the second p-type region, wherein the first n-type region forms an emitter of a bipolar NPN transistor and is a second output of the integrated optical switch circuit, wherein the second p-type region serves as a base region of the bipolar NPN transistor, wherein the n-substrate near the second p-type region serves as the collector region of the bipolar NPN transistor and wherein the PNP and the NPN form a SCR;
   a third p-type region in the n-type substrate, wherein the n-type substrate and the third p-type region form a photo diode, the photo diode is used to disable the SCR;

a fourth p-type region in the n-type substrate;
a second n-type region is formed in the fourth p-type region, wherein the second n-type region and the fourth p-type region form a zener diode;
a third n-type region in the fourth p-type region, wherein the third n-type region forms a drain region of a n-channel MOSFET;
a fourth n-type region in the fourth p-type region, wherein the fourth n-type region forms a source region of the n-channel MOSFET;
a gate on the n-channel MOSFET;
a first resistor couples the n-substrate to the second p-type region, the first resistor is used in conjunction with the n-channel MOSFET to disable the SCR; and
a second resistor couples the second p-type region to the second output of the integrated optical switch circuit, wherein the first and second resistors form a voltage divider which enables the SCR when the n-channel MOSFET is disabled.

10. The integrated optical switch circuit of claim 9, wherein the first, second, and third p-type regions have substantially similar doping levels.

11. The integrated optical switch circuit of claim 9, wherein the first, second, third, and fourth n-type regions have substantially similar doping levels.

12. The integrated optical switch circuit of claim 9, wherein additional n-type regions are formed in the n-substrate near the first, second, third, and fourth p-type regions as substrate contacts.

13. The integrated optical switch circuit of claim 14, wherein the first and second resistors are made from substantially similar material, thereby allowing a voltage divider formed by the first and second resistors to track over temperature.

14. The integrated optical switch circuit of claim 9, wherein the first resistor is a higher resistance value than the second resistor, a voltage divider is formed by the first and second resistors which enables the SCR at a predetermined voltage.

15. An optical switch integrated on a monolithic semiconductor chip, comprising:
an SCR;
means to enable coupled to the SCR;
means to disable coupled to the means to enable; and
a photo detector coupled to the means to disable for disabling the SCR when the photo detector is activated, wherein the SCR, means to enable, means to disable, and photo detector are integrated on a monolithic semiconductor chip.

16. The optical switch integrated on a monolithic semiconductor chip of claim 15, further including:
exposing the photo detector on the monolithic semiconductor chip to ambient lighting.

17. The optical switch integrated on a monolithic semiconductor chip of claim 15, wherein the SCR is formed from a lateral bipolar PNP transistor and a vertical bipolar NPN transistor.

18. The optical switch integrated on a monolithic semiconductor chip of claim 15, wherein the means for disabling disables the SCR and the means to enable.

19. The optical switch integrated on a monolithic semiconductor chip of claim 15, further including:
a voltage clamping means in series with the photo detector, wherein the voltage clamping means limits voltage across the means to disable.

20. The optical switch integrated on a monolithic semiconductor chip of claim 15, further including:
means for sinking leakage current from the photo detector, wherein the means for sinking leakage current prevents leakage current from the photo detector from enabling the means for disabling.

* * * * *